United States Patent
Nakayama et al.

(10) Patent No.: US 8,263,929 B2
(45) Date of Patent: Sep. 11, 2012

(54) STANDARD MEMBER FOR CORRECTION, SCANNING ELECTRON MICROSCOPE USING SAME, AND SCANNING ELECTRON MICROSCOPE CORRECTION METHOD

(75) Inventors: Yoshinori Nakayama, Sayama (JP); Yasunari Sohda, Kawasaki (JP); Keiichiro Hitomi, Delmar, NY (US)

(73) Assignee: Hitachi High-Technologies Corporation, Tokyo (JP)

( * ) Notice: Subject to any disclaimer, the term of this patent is extended or adjusted under 35 U.S.C. 154(b) by 38 days.

(21) Appl. No.: 13/057,235

(22) PCT Filed: Jul. 31, 2009

(86) PCT No.: PCT/JP2009/003646
§ 371 (c)(1),
(2), (4) Date: Feb. 2, 2011

(87) PCT Pub. No.: WO2010/016211
PCT Pub. Date: Feb. 11, 2010

(65) Prior Publication Data
US 2011/0133065 A1 Jun. 9, 2011

(30) Foreign Application Priority Data
Aug. 6, 2008 (JP) .................................. 2008-203174

(51) Int. Cl.
*G01J 1/10* (2006.01)
(52) U.S. Cl. .................................. 250/252.1; 356/243.4
(58) Field of Classification Search ............... 250/252.1; 356/243.1, 243.4, 243.7, 243.8
See application file for complete search history.

(56) References Cited

U.S. PATENT DOCUMENTS 6,459,482 B1 * 10/2002 Singh et al. ................ 356/243.1
6,570,157 B1   5/2003 Singh et al.

FOREIGN PATENT DOCUMENTS

| JP | 7-218201 A | 8/1995 |
| JP | 8-94346 A | 4/1996 |
| JP | 8-285502 A | 11/1996 |
| JP | 3104899 B2 | 9/2000 |
| JP | 2003-279321 A | 10/2003 |
| JP | 2006-134952 A | 5/2006 |

OTHER PUBLICATIONS

Corresponding International Serach Report dated Nov. 2, 2009 with English Translation (Four (4) pages).
Ichiko Misumi, et al., "Design and Fabrication of Nanometric Lateral Scale Consisting of GaAs/InGaP Superlattice", XVIII Imeko World Congress, Metrology for a Sustainable Development, Sep. 17-22, 2006, Rio de Janeiro, Brazil (Four (4) pages).

* cited by examiner

*Primary Examiner* — Mark R Gaworecki
(74) *Attorney, Agent, or Firm* — Crowell & Moring LLP

(57) ABSTRACT

Disclosed is a standard specimen, used with an electron microscope to correct the magnification with high precision. A standard member used for correction corrects a scanning electron microscope that measures a pattern within an observation region based on information about the secondary electrons generated by scanning incident electron lines on the observation region on a measurement specimen, or information about the reflected electron intensity. The standard member has a first pattern region that corrects the magnification and that comprises a concavo-convex pattern (line/space pattern) in the cross section of a multilayer film that has been laminated, and a second pattern region near the first pattern at almost the same height that does not contain a pattern with the same periodicity as the pattern pitch size of the first region and that is used for beam adjustment.

20 Claims, 9 Drawing Sheets

FIG. 2
(A) SAMPLE BONDING BETWEEN CROSS-SECTION SURFACES
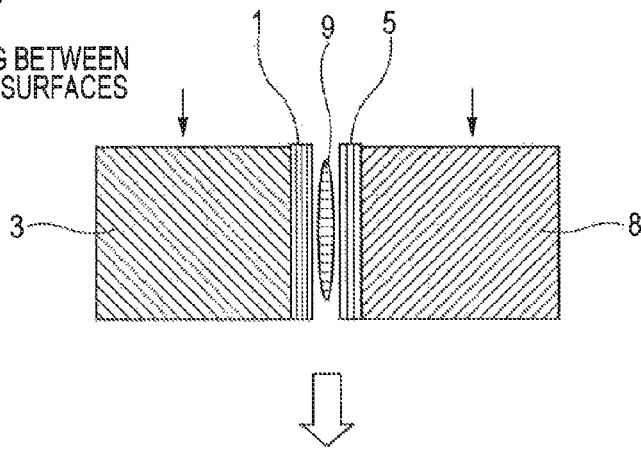
(B) MATERIAL SELECTIVE ETCHING
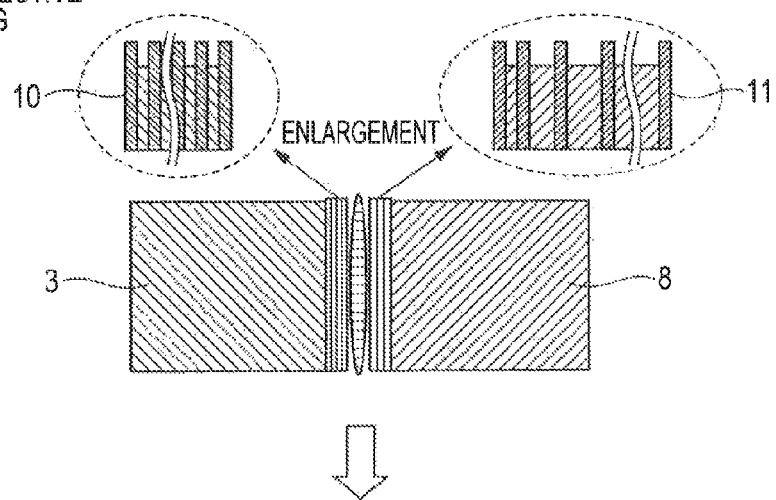
(C) HOLDER MOUNTING WITH BONDING
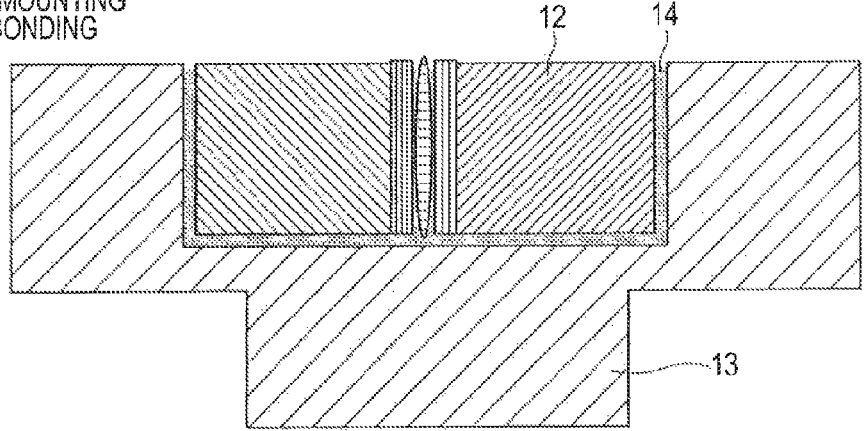

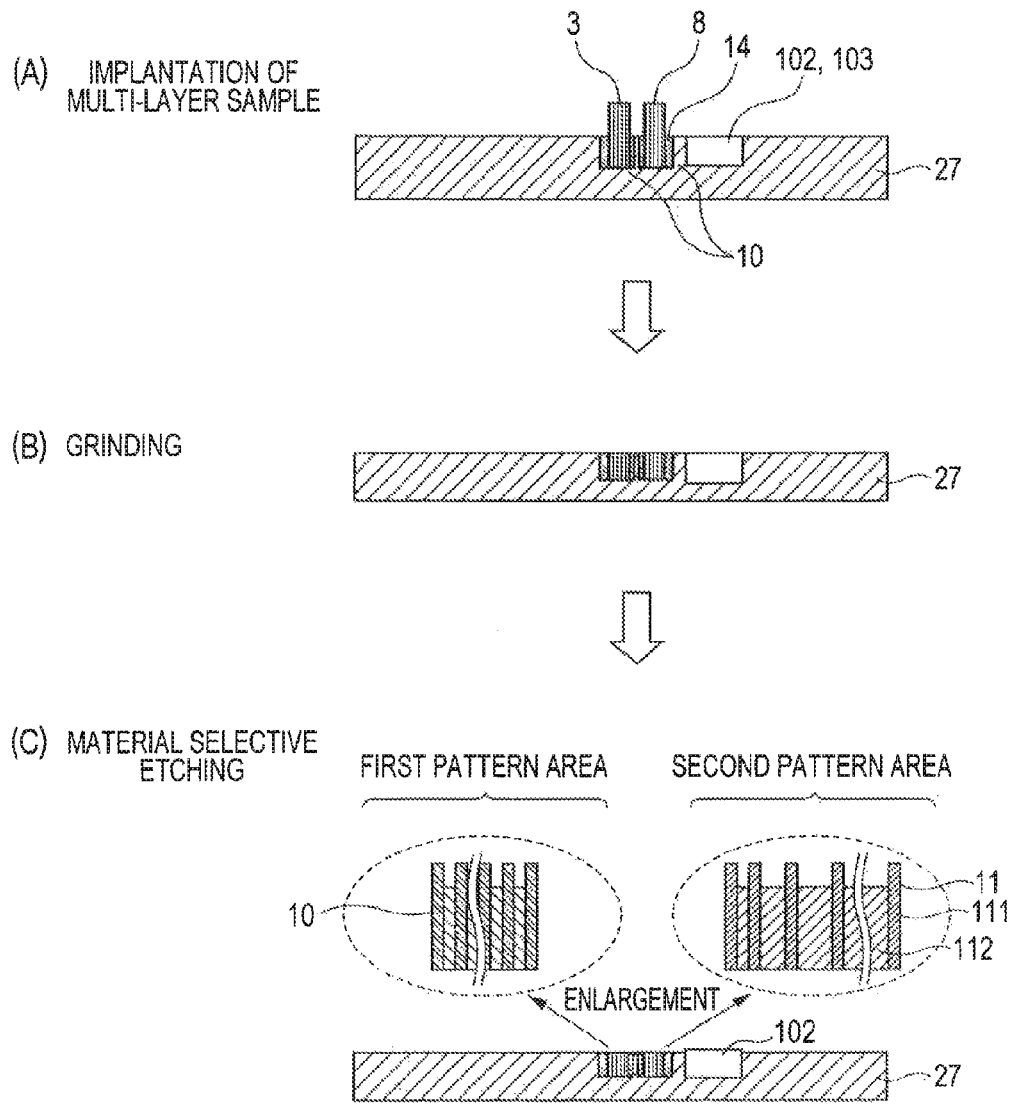

STANDARD MEMBER FOR CORRECTION, SCANNING ELECTRON MICROSCOPE USING SAME, AND SCANNING ELECTRON MICROSCOPE CORRECTION METHOD

TECHNICAL FIELD

The present invention relates to a standard sample for calibrating a scanning electron microscope, a scanning electron microscope using the standard member, and a scanning electron microscope calibration method.

BACKGROUND ART

In recent years, semiconductor devices have become increasingly finer-structured, so that higher-precision size management is required. Accordingly, size management using an electron beam length measurement device based on a scanning electron microscope is performed in manufacturing scenes. The measurement precision of the size management is determined by the magnification calibration precision of the scanning electron microscope.

Patent documents 1 and 2 disclose a configuration in which a pattern for calibration has different pitches of fine sizes on the order of 1 μm. However, higher-magnification measurement for finer semiconductor devices narrows the visual field of the scanning electron microscope, which requires the pattern of the standard sample for calibrating the magnification to be equal to or better in fineness than semiconductor patterns.

On the other hand, patent document 3 and non-patent document 1 propose a superlattice sample as a calibration sample having fineness of a pitch size of not greater than 100 nm.

PRIOR ART DOCUMENTS

Patent Document
[Patent document 1] Japanese Patent Application Laid-Open Publication No. 8-285502
[Patent document 2] Japanese Patent Application Laid-Open Publication No. 2003-279321
[Patent document 3] Japanese Patent No. 3104899
Non-Patent Document
[Non-patent document 1] Misumi et al., "DESIGN AND FABRICATION OF NANOMETRIC LATERAL SCALE CONSISTING OF GaAs/InGaP SUPERLATTICE, pp. 1091"

SUMMARY OF THE INVENTION

Problems to be Solved by the Invention

The calibration sample, according to the conventional technique, to be used for the magnification calibration of the scanning electron microscope has the following problems. In the case where a cross-section sample is used as the calibration sample, the implantation of the sample into a substrate causes a step with respect to a substrate surface. Since in the scanning electron microscope used for semiconductor inspection, voltage is applied to the sample side to control electron beam accelerating voltage (retarding); the step causes a surface electric field distribution locally at the step part, which leads to astigmatism. As a result, the calibration precision becomes worse.

For this reason, in the superlattice sample described in patent document 3 and non-patent document 1, there is adopted a method in which the same cross-section samples are bonded and implanted into the substrate. However, such a sample has the following problems.

First, it is not easy to perform beam adjustment. That is, at the time of calibrating the magnification of the scanning electron microscope, it is necessary to precisely adjust focus, astigmatism, and the like on the calibration sample to make a high-definition electron beam. Usually, the pattern of the calibration sample is configured with about a measurement pattern size or smaller. Therefore, even if the pattern of the calibration sample is moved directly under the beam by stage movement, due to the high definition of the pattern, it is not possible to resolve the pattern before electron beam aberration adjustment. Accordingly, it is not easy to perform beam adjustment including the focus of the electron beam.

If the pitch size of the pattern for calibration is enlarged so as to precisely adjust the focus etc. of the electron beam, it is not possible to perform calibration on high-magnification condition used for a fine pattern to be measured. Accordingly, it is necessary to prepare a pattern for beam adjustment at a different location on the stage. However, if the pattern for beam adjustment and the pattern for magnification calibration are not placed at the same height, adjustment conditions differ according to sample heights, so that it is not possible to implement electron beam aberration adjustment and magnification calibration at the same time.

Secondly, in the pattern for magnification calibration, the pitch size needs to be obtained with high precision beforehand by some kind of measurement means. In a periodic pattern of the same pitch size, diffraction angle measurement with light or X-rays enables the pitch size to be measured with high precision. In the diffraction angle measurement with light or X-rays, an area of 1 mm square or larger in the calibration sample is irradiated with light or X-rays to obtain an average pitch size within the irradiated area.

However, the superlattice sample described in patent document 3 and non-patent document 1 has a structure in which the cross-section samples of the same pitch size are bonded back to back; accordingly, in the diffraction angle measurement with light or X-rays, the two cross-section samples bonded back to back are irradiated with light or X-rays. In this measurement, in the case where the interlayer pitch sizes of the two cross-section samples are exactly the same and the distance between the two cross-section samples is not exactly an integral multiple of the interlayer pitch, diffraction rays interfere with each other, which attenuates the diffraction intensity, preventing high-precision measurement. On the other hand, in the case where the interlayer pitch sizes of the two cross-section samples are slightly different, diffraction rays overlap each other, and an average pitch size of the interlayer pitch sizes of the two cross-section samples is obtained. Since the sample is measured at a high magnification in the magnification calibration of the scanning electron microscope, calibration with the interlayer pitch size of one cross-section sample disadvantageously causes an error.

It is therefore an object of the present invention to provide a standard member for calibration, used with an electron microscope to calibrate the magnification with high precision, a scanning electron microscope using the standard member, and a scanning electron microscope calibration method.

Means of Solving the Problems

To solve the above problems, the present invention has a basic configuration in which a pattern for magnification calibration composed of a periodic pattern of the same pitch size and a pattern for precisely adjusting focus, astigmatism, and the like to make a high-definition electron beam are arranged adjacently at the same height.

A typical configuration of the present invention is as follows. A standard member for calibration according to the invention is a standard member for calibrating a scanning electron microscope, and includes, in the scanning electron microscope which measures a pattern within an observation area based on information about an intensity of a secondary electron or a reflected electron generated by scanning an incident electron ray on the observation area on a measurement sample, a first pattern area having a convex-concave pattern of a multilayer film cross section formed by laminating materials of different periods at a constant and fixed multi-layer pitch, and a second pattern area having a convex-concave pattern of a multilayer film cross section formed by laminating different materials at a variable multi-layer pitch which provides varying pitch sizes in one direction, wherein in the first pattern area and the second pattern area, the two convex-concave patterns are arranged adjacently on one axis and at substantially a same height, and the variable multi-layer pitch in the second pattern area includes at least one pitch size for coarse adjustment larger than the fixed multi-layer pitch in the first pattern area and at least one pitch size for high-definition adjustment smaller than the fixed multi-layer pitch in the first pattern area.

Further, the convex-concave period of the multi-layer part is obtained beforehand by light or X-ray diffraction, and the standard member is mounted on the electron microscope. The pattern for electron beam aberration adjustment does not contain the same periodicity as the convex-concave period; therefore, it is possible to obtain the pitch size of the convex-concave period with high precision by light or X-ray diffraction. After precisely adjusting focus, astigmatism, and the like to make a high-definition electron beam with the scanning electron microscope and with the pattern for adjustment, the result of measuring the multi-layer convex-concave period is compared with the multi-layer convex-concave period obtained by light or X-ray diffraction, thereby calibrating the magnification of the scanning electron microscope.

Hereinafter, characteristic configuration examples included in the invention will be described.

(1) A standard member for calibration according to the invention is a standard member for calibrating a scanning electron microscope which measures a pattern within an observation area based on information about an intensity of a secondary electron or a reflected electron generated by scanning an incident electron ray on the observation area on a specimen, and has a first pattern area having a multi-layer convex-concave period produced by performing multi-layer material selective etching on the substrate cross section of a laminated multilayer film and a second pattern area composed of a pattern for adjustment to make a high-definition electron beam.

(2) In the standard member for calibration having the above configuration, the second pattern area composed of the pattern for adjustment to make the high-definition electron beam has, for easier adjustment, a pitch size for coarse adjustment larger than a pitch size in the first pattern area and a pitch size for high-definition adjustment smaller than the pitch size in the first pattern area, and the first pattern area and the second pattern area are arranged within a focus tolerance range of 1 micrometer closely within a beam detection range of 10 micrometers, which leads to flatness and does not cause a surface electric field distribution locally at a step part, and enables magnification calibration in the first pattern area in a beam state after the high-precision beam adjustment.

(3) In the standard member for calibration having the above configuration, the pitch size of the convex-concave pattern (line/space pattern) in the first pattern area is obtained by light or X-ray diffraction, and the second pattern area has a pattern configuration that does not affect the precision of measurement by light or X-ray diffraction, that is, a configuration that does not include the patterns of the pitch size of the convex-concave pattern (line/space pattern) in the first pattern area and pitch sizes which are integral multiples thereof. As a result, instead of thickness measurement in a sample deposition stage, the pitch size of the cross-section convex-concave pattern (line/space pattern) after the completion of the calibration sample bonded to the pattern cross section for adjustment is obtained; therefore, the pitch size of the convex-concave pattern (line/space pattern) of the calibration sample in a state of being mounted on the electron microscope with the addition of influence such as pattern deformation during sample production is obtained. Further, the pitch size is measured based on secondary electron and reflected electron signals from sample convex-concave information at an electron beam irradiation position from the same sample surface obtained by actual electron microscope measurement, which enables comparison and calibration using geometry information value with the same sample location and the same convex-concave as by light or X-ray diffraction and therefore enables high-precision device calibration.

(4) A scanning electron microscope according to the invention has a sample stage for holding a sample, an irradiation optical system for scanning an electron beam on the sample on the sample stage, a detector for detecting a secondary electron or a reflected electron generated by electron beam scanning, signal processing means for performing length measurement of the sample by processing an electronic signal obtained from the detector, display means for displaying a result of length measurement, and the above-described standard member for calibration used to calibrate a magnification of the irradiation optical system based on information about an intensity of the secondary electron or the reflected electron.

(5) In the scanning electron microscope having the above configuration, in a high-definition beam state after the adjustment of electron beam aberration such as focus and astigmatism in the second pattern area, the pitch size of the convex-concave pattern (line/space pattern) in the first pattern area is measured. The result is compared with a pitch size obtained beforehand by light or X-ray diffraction, thereby calibrating the magnification of the irradiation optical system so that the difference becomes approximately zero.

(6) In the scanning electron microscope having the above configuration, the standard member for calibration is mounted on the sample stage.

Effects of the Invention

According to the present invention, it is possible to provide a scanning electron microscope technique including a standard member for calibration, used with an electron microscope to calibrate the magnification with high precision.

BRIEF DESCRIPTION OF THE DRAWINGS

FIG. 2 is a view illustrating the production method of the standard member according to the first embodiment of the invention.

FIG. 7 is a view illustrating the production method of the standard sample according to the second embodiment.

MODE FOR CARRYING OUT THE INVENTION

Hereinafter, embodiments of the present invention will be described in detail with reference to the accompanying drawings.

First Embodiment

The configuration and manufacturing method of a standard member for calibration according to the first embodiment of the invention will be described with reference to FIGS. 1 to 2. FIG. 1 (FIGS. 1A and 1B) is schematic views of the standard member for calibration according to the invention, in which FIG. 1B is a perspective view showing the entirety of a pattern for calibration, and FIG. 1A is an enlarged view showing a pattern area for calibration shown in FIG. 1B.

Figure 1A:
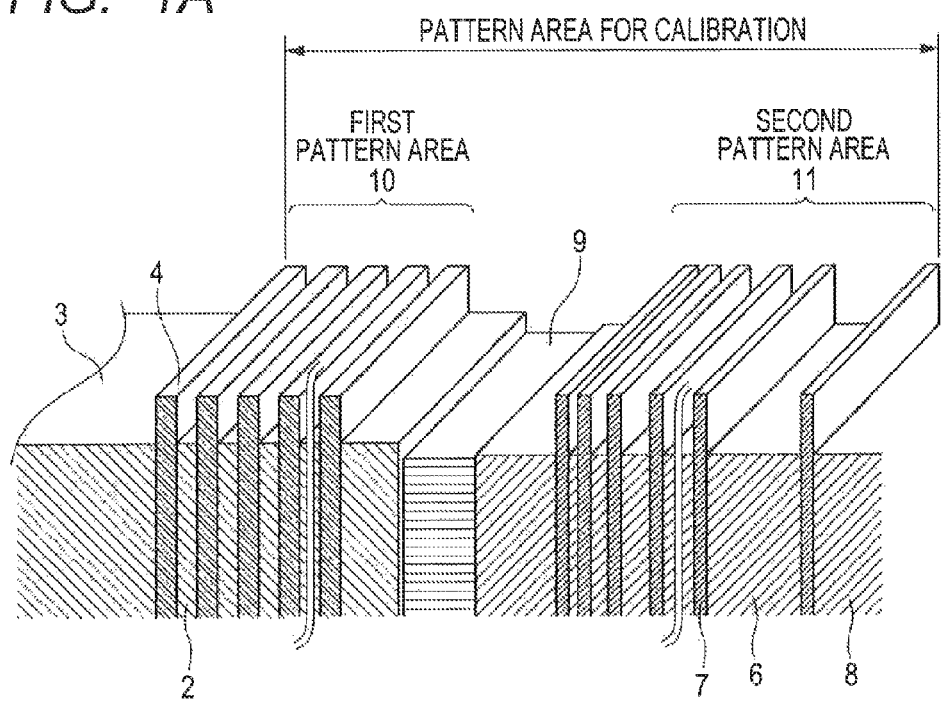
FIG. 1A is a schematic view showing a standard member for calibration according to a first embodiment of the present invention and is an enlarged view showing a pattern area for calibration shown in FIG. 1B.
Figure 1B:
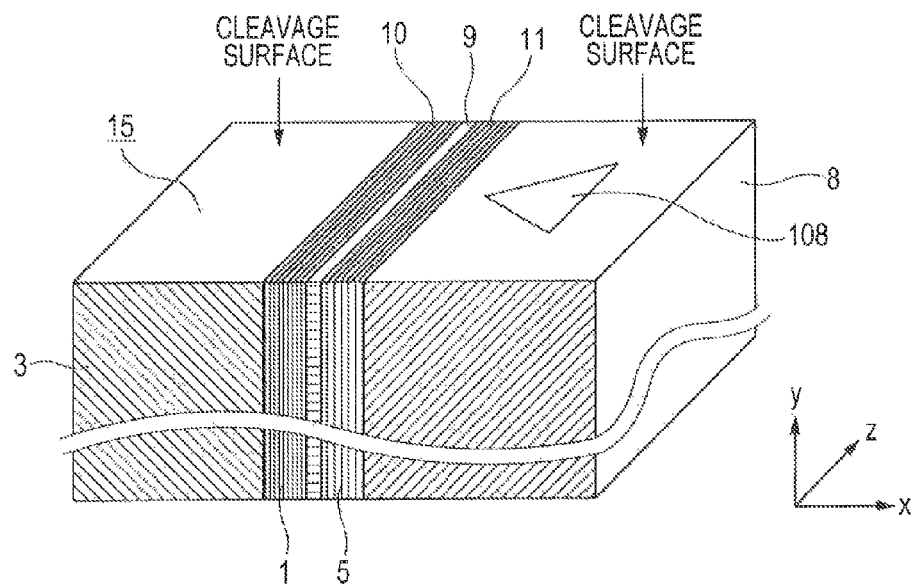
FIG. 1B is a schematic perspective view showing the standard member for calibration according to the first embodiment of the invention.

As shown in FIG. 1B, a standard member 15 for calibration has a multi-layer structure part (a first pattern area) 1 and a multi-layer structure part (a second pattern area) 5 which are formed on the end surfaces of a pair of silicon substrates 3 and 8 and bonded with a conductive adhesive 9. Further, a pattern position identification mark 108 is provided on the top surface of the silicon substrate 8. The arrow indicates the cleavage surface part of the silicon substrate.

As shown in FIG. 1A, in the standard member for calibration, the first pattern area 10, which is a magnification calibration part, having a multi-layer convex-concave period produced by performing multi-layer material selective etching on the substrate cross section of a laminated multilayer film, the second pattern area 11 composed of a pattern for adjustment to make a high-definition electron beam, and the conductive adhesive 9 for bonding these two pattern areas are formed in the "pattern area for calibration". That is, the first pattern area 10 and the second pattern area 11 are arranged adjacently in series on one axis in the longitudinal direction (x direction) of the standard member for calibration and at substantially the same height, and the widths (in the z direction) of the two pattern areas are substantially the same. Further, the heights (in the y direction) of the substrate surfaces of the first pattern area 10 and the second pattern area 11 are the same. That is, the height of the substrate surface of the first pattern area 10 with respect to incident electrons is substantially the same as the height of the substrate surface of the second pattern area 11 with respect to incident electrons.

The first pattern area 10 has a convex-concave pattern (line/space pattern) formed by alternately laminating a plurality of silicon layers 2 of the same thickness and a plurality of molybdenum layers 4 of the same thickness, i.e., has the silicon/molybdenum multi-layer structure 1. For example, 40 silicon layers and 40 molybdenum layers, each layer having a thickness of 10 nm, are formed by ion beam deposition. In the first pattern area 10, the silicon substrate 3 and the silicon layers 2 in the multi-layer structure 1 formed in the silicon substrate 3 undergo material selective etching by about 20 nm in depth, thereby making the substrate surface and forming the periodic convex pattern (line pattern) of the molybdenum layers 4 protruding from the substrate surface.

On the other hand, the multi-layer structure part 5 forming the second pattern area 11 is formed by alternately laminating a plurality of silicon layers 6 of stepwise increasing thicknesses and a plurality of molybdenum layers 7 of the same thickness. In the second pattern area 11, the silicon substrate 8 and the silicon layers 6 in the multi-layer structure 5 formed in the silicon substrate 8 undergo material selective etching by about 20 nm in depth, thereby making the substrate surface and forming the multi-layer convex-concave pattern (line/space pattern) of the second silicon/molybdenum (Si/Mo) 7 protruding from the substrate surface.

In this embodiment, the molybdenum layers 4 in the first pattern area 10 are arranged in substantially the same pitch size. That is, the first pattern area 10 has a multilayer film structure formed by laminating materials of different periods at a substantially constant and fixed multi-layer pitch. On the other hand, the silicon layers 6 in the second pattern area 11 contain thinner layer and thicker layer than the silicon layers 2 in the first pattern area 10. The second pattern area 11 has a variable multi-layer pitch at which the period pitch sizes of the molybdenum layers 7 of the same thickness increase continuously from the conductive adhesive 9 side toward the outside.

FIG. 2 is a view showing the production method of the standard member 15 for calibration. First, as shown in part (A) of FIG. 2, cleavage and bonding are performed on cross-section samples. That is, for the silicon/molybdenum multi-layer 1, the silicon substrate 3 of 500 μm thick obtained by alternately forming, by ion beam deposition, 40 silicon layers and 40 molybdenum layers, each layer having a thickness of 10 nm, is cut out by cleavage in the size of 10 mm long and 3 mm wide, as shown in part (A).

Next, similarly, for the silicon/molybdenum multi-layer 5, the silicon substrate 8 of 500 μm thick obtained by alternately forming, by ion beam deposition, 20 silicon layers 6 with thicknesses increasing from 2 nm to 40 nm by 2 nm and the molybdenum layers 7 having a constant width of 5 nm is cut out by cleavage in the size of 10 mm long and 3 mm wide.

Then, the multi-layer surfaces of these two cross-section samples 3 and 8 are bonded back to back with the conductive adhesive 9 such that the cleavage surfaces of the two samples are at the same height, thereby obtaining a bonded cross-section sample 12.

Next, as shown in part (B) of FIG. 2, material selective etching is performed on the cross-section sample 12. That is, the bonded cross-section sample 12 is soaked in a potassium hydroxide aqueous solution for etching. As a result, only the silicon substrates 3 and 8 and the silicon layers 2 and 6 on the cleavage surface are etched by about 20 nm in depth. Thereby, on the cross section of one substrate 3 of the bonded sample, the periodic convex pattern (line pattern) 10 of the molybdenum layers 4 is formed as the first pattern area. Further, on the cross section of the other substrate 8, the pattern 11 including the arrangement of the convex pattern (line pattern) of the molybdenum layers 7 having a width of 5 nm and having the inconstant pitch, i.e. the period pitch that decreases at smaller distances from the deposition surface is formed as the second pattern area.

Next, as shown in part (C) of FIG. 2, the cross-section sample 12 is bonded to a holder. First, in order to determine which of the left and right pattern areas 10 and 11 of the bonded cross-section sample 12 corresponds to the first pattern area or the second pattern area, the triangular pattern position identification mark 108 (see FIG. 1B) is formed on the silicon substrate 8 near the second pattern area e.g. by 1 µm in depth by ion beam etching such that the second pattern area is located at the vertex of the triangle. Then, the etched bonded cross-section sample 12 is implanted in the concave part of a holding holder 13 and fixed with a conductive adhesive 14, thereby completing the standard member 15.

For example, the cross-section sample 12 is implanted in the concave part of 1.1 mm wide and 3 mm deep of the holding holder 13 of 20 mm high and 20 mm diameter such that the surface matches the surface of the holder, and fixed with the conductive adhesive 14, thereby obtaining the standard member 15. At this time, it is desirable that the size of the "pattern area for calibration" shown in FIG. 1A which is the horizontal distance from the outside end of the first pattern area to the outside end of the second pattern area in the two cross-section samples be not greater than 10 µm. Further, it is desirable that the difference in height between the left and right pattern areas 10 and 11, that is, the difference in height between the substrate surface of the first pattern area 10 and the substrate surface of the second pattern area 11 be not greater than 1 µm.

The standard member 15 for calibration according to this embodiment is used to calibrate a scanning electron microscope which measures a pattern within an observation area based on information about the intensity of secondary electrons or reflected electrons generated by scanning incident electron rays on the observation area on a specimen. By way of example, diffraction angle measurement by the X-ray diffraction method with a wavelength of 0.15 nm was performed on the standard member 15 with the horizontal distance of the "pattern area for calibration" being 8 µm and the difference in height between the substrate surfaces being 0.5 µm. As a result, clear diffracted light of up to third or higher order which is not affected from the pattern in the second area 11 was obtained, and a pitch size of 19.98 nm was obtained as the periodic convex-concave pattern (line/space pattern) period of the molybdenum layers 4 and the silicon layers 2 in the first pattern area 10. This pitch size is the average value of the convex-concave pattern (line/space pattern) on the whole surface of the cross-section sample 12 irradiated with X-rays in the measurement.

With the standard member for calibration according to this embodiment, it is possible to implement the electron beam aberration adjustment and magnification calibration of the scanning electron microscope with high precision at the same time.

Second Embodiment

Next, as the second embodiment of the invention, a scanning electron microscope (SEM) using the standard member for calibration produced based on the first embodiment and a scanning electron microscope calibration method will be described.

Figure 3:
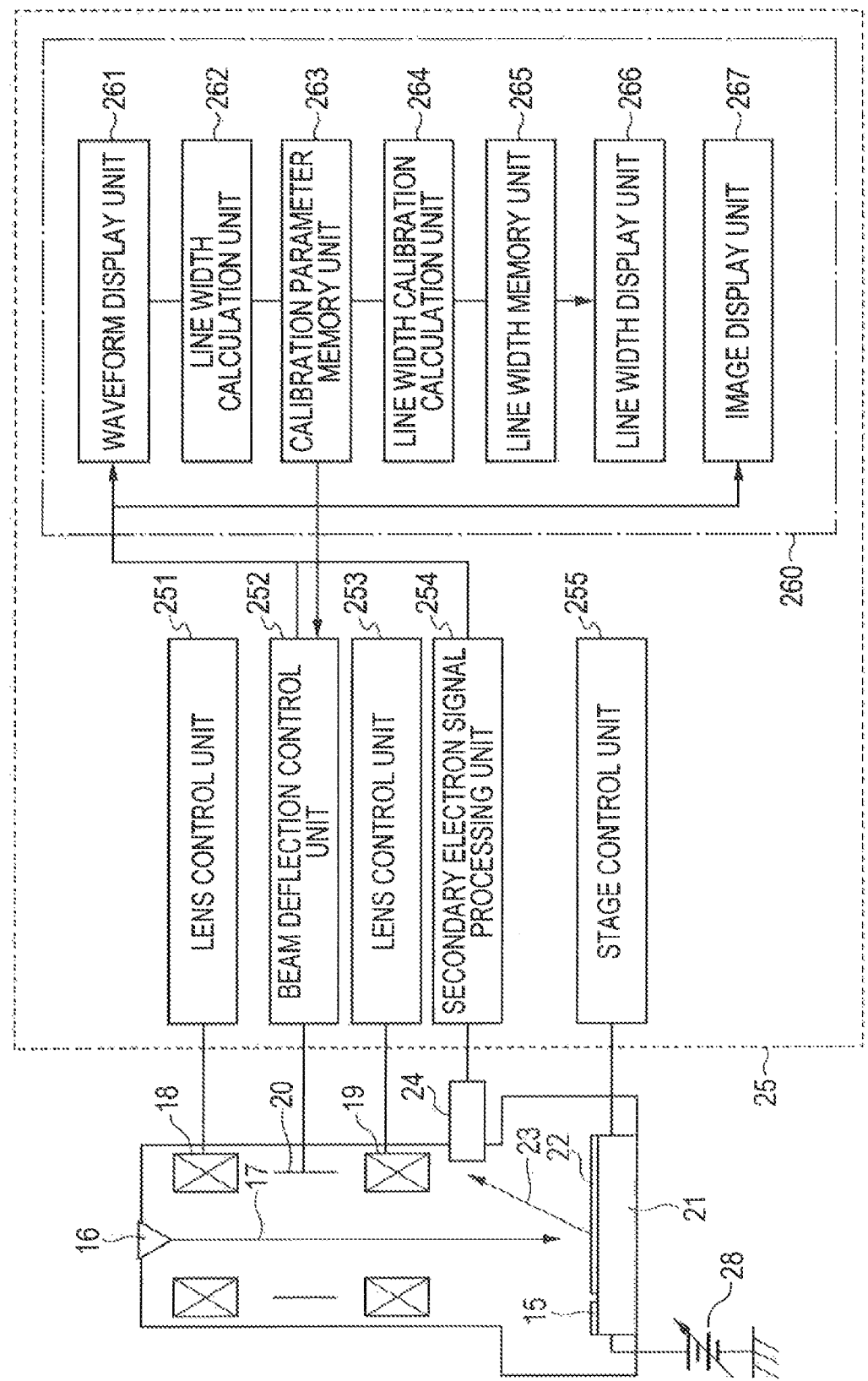
FIG. 3 is a view illustrating a system configuration example of a scanning electron microscope using the standard member for calibration according to the first embodiment.
Figure 4:
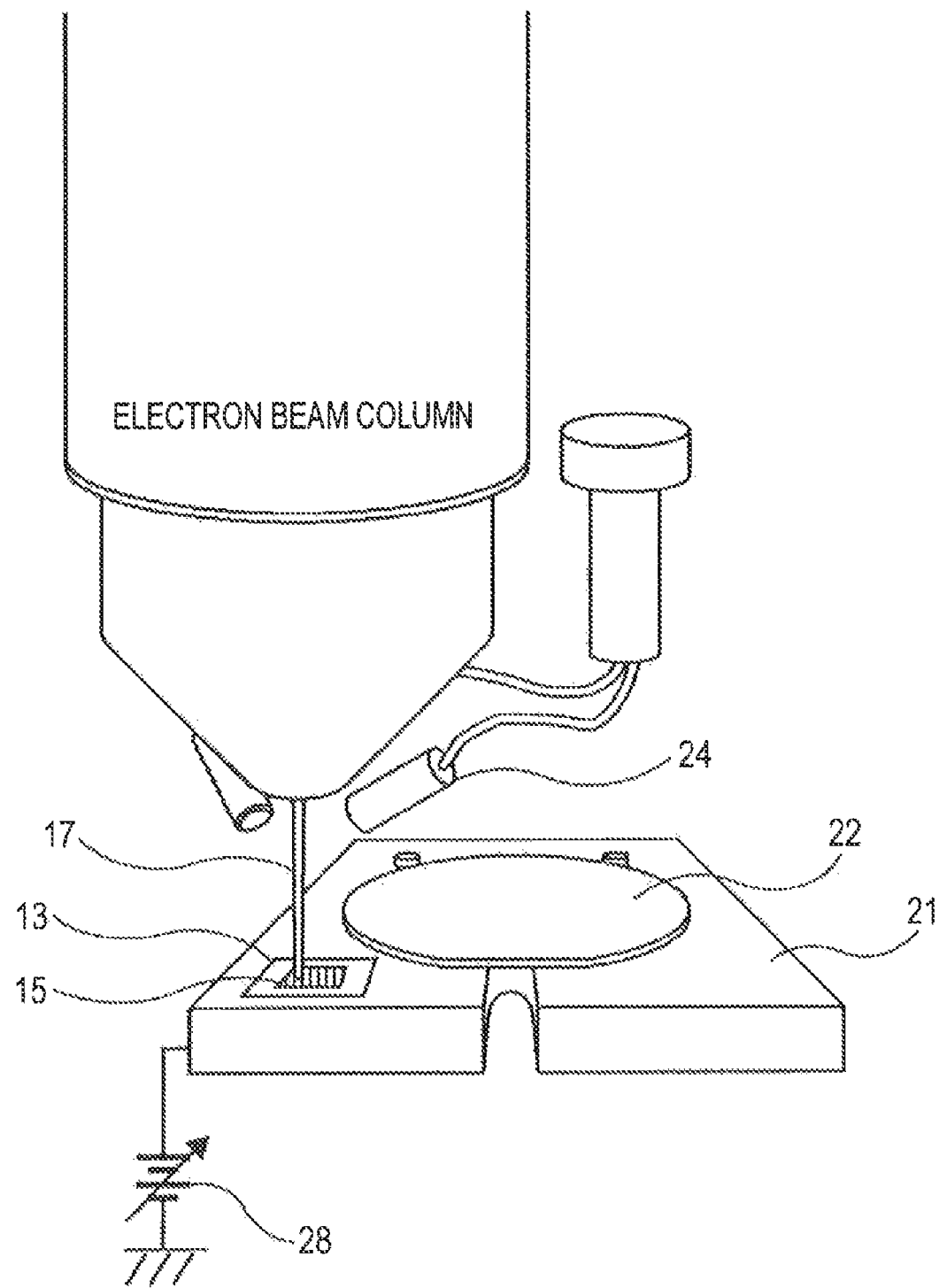
FIG. 4 is a view showing a usage state of the standard member for calibration according to the first embodiment.
Figure 5:
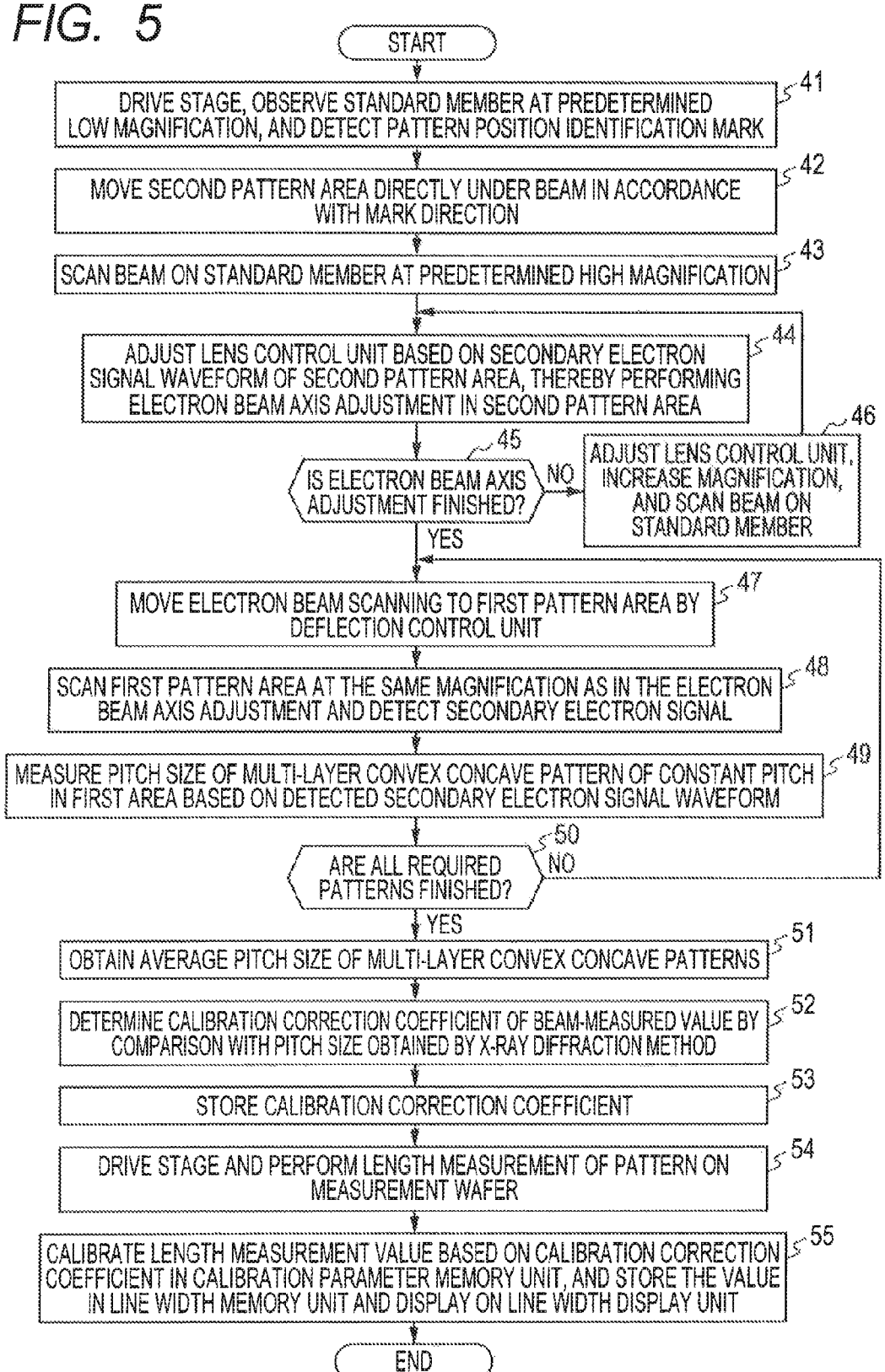
FIG. 5 is a flowchart for magnification calibration using the standard member for calibration according to the first embodiment.

FIG. 3 is a schematic view showing the system configuration of the scanning electron microscope according to the invention. FIG. 4 is an enlarged perspective view of the stage part of the scanning electron microscope. FIG. 5 is a flowchart for the magnification calibration of the scanning electron microscope according to the invention.

As shown in FIGS. 3 and 4, in this embodiment, the standard member 15 formed by implanting the cross-section sample 12 of the silicon/molybdenum (Si/Mo) multi-layer structure described in the first embodiment in the holder 13 is mounted on a stage 21 of the scanning electron microscope, thereby to calibrate the scanning electron microscope. Further, a measurement sample (wafer) 22 is placed on the stage 21. Further, a bias supply 28 for applying voltage to control beam accelerating voltage is connected to the stage 21.

A brief description will now be made of a general configuration example of the scanning electron microscope to which the invention is applied. The scanning electron microscope includes an electron gun (electron source) 16 for emitting an electron beam 17, a scanning deflector 20 for scanning the electron beam 17 on the sample, lenses 18 and 19 for adjusting the focus of the electron beam on the length measurement sample 22, an electron detector 24 for detecting a secondary electron 23 generated by primary electron ray irradiation, and a SEM control system 25 including an information processing device 260. The SEM control system 25 is composed of a lens control unit 251 for controlling the lens 18, a beam deflection control unit 252 for controlling the scanning deflection of the primary electron ray, a lens control unit 253 for controlling the lens 19, a secondary electron signal processing unit 254 for processing an output signal from the electron detector 24, a stage control unit 255 for controlling the movement of the stage 21 on which the length measurement sample 22 or the standard member 15 is placed, and the like. The information processing device 260 constituting the SEM control system 25 is composed of a calculation processing unit (a line width calculation unit 262, a line width calibration calculation unit 264) composed of a CPU for calculating information and a control signal inputted from the SEM control unit, a memory (not shown) for storing various kinds of software for magnification calibration processing etc. which operate on the CPU, an external memory device (a calibration parameter memory unit 263, a line width memory unit 265) for storing information such as a length measurement recipe and various kinds of software, and the like. Further, a display unit (a waveform display unit 261, a line width display unit 266, an image display unit 267) for displaying the result of information processed by the CPU, information input means (not shown) for inputting information necessary for information processing to the information processing device, and the like are connected to the information processing device 260.

In FIG. 3, each calculation unit, control unit, and display unit are included in the control system 25, but not necessarily included in the control system 25.

As shown in FIG. 4, in this embodiment, the standard member 15 and the length measurement sample 22 are placed on the same stage 21.

Next, the operation of the scanning electron microscope will be described briefly. The electron beam 17 emitted from the electron gun (electron source) 16 is scanned on the sample by the lenses 18 and 19 and the deflector 20. Bias voltage is applied to the stage 21 to control beam accelerating voltage. In the scanning electron microscope used for semiconductor inspection, the voltage is applied to the sample side to control the electron beam accelerating voltage. For example, in the case where a semiconductor substrate having an insulating film as a measurement sample is mounted on the stage 21; with the application of a negative bias voltage against the electron gun (electron source) 16 of 4 KV, the applied voltage is reduced to 1 KV or less, thereby retarding the electron beam 17. Further, based on a signal from the electron detector 24 for detecting the secondary electron 23 generated by electron beam irradiation, the display and length measurement of a secondary electron (or reflected electron) image and a secondary electron signal waveform are performed. A stage position at this time is detected and controlled by the stage control unit 255.

Next, referring to FIGS. 3 and 4, the procedure of magnification calibration according to the invention will be described along the flowchart of FIG. 5. First, the standard member 15 containing the cross-section sample 12 of the silicon/molybdenum (Si/Mo) multi-layer structure produced based on the first embodiment in the holder 13 is mounted on the stage 21. Then, the stage 21 is moved, and at a first predetermined magnification, e.g., magnification as low as 10000×, the pattern position identification mark 108 on the sample shown in FIG. 1B is detected (step 41).

Next, the electron beam is scanned on the standard member 15 at the first predetermined magnification. A voltage of −1.5 kV is applied to the stage 21 so that the beam accelerating voltage becomes e.g. 500 V.

Assume that the first predetermined magnification, e.g., 10000× magnification is a low magnification at which the entirety of the standard member 15 shown in FIG. 1B is viewed within the same visual field and even the largest pattern in the standard member 15 is not supported. The multi-layer convex-concave structures in the pattern areas of the multi-layer convex-concave structure cross-section sample 12 are too small to distinguish between the first and second pattern areas at this low magnification; however, the pattern position identification mark 108 on the sample easily enables the distinction between the pattern areas and positioning.

Next, in accordance with the direction information, the stage is driven so that the second pattern area of the cross-section sample 12 of the multi-layer convex-concave structure is positioned directly under the electron beam 17 (step 42). At a second predetermined magnification, e.g., 100000× magnification, the beam is scanned on the standard member (step 43). That is, the silicon/molybdenum (Si/Mo) multi-layer convex-concave structure part of the standard member is positioned directly under the beam, and beam scanning is performed at 100000× magnification, and a secondary electron signal waveform obtained through the secondary electron signal processing unit is observed on the waveform display unit. Then, based on the secondary electron signal waveform in the second pattern area, the lens control unit is adjusted to perform a coarse adjustment in an electron beam axis adjustment, using a large pattern in the second pattern area (step 44).

Assume that the second predetermined magnification is such a high magnification as to support the largest pattern in the second pattern area larger than the pattern 10 of the first area. This magnification does not support smaller patterns in the standard member 15. Accordingly, the lens control unit is adjusted for a magnification increase, and beam scanning is performed on the standard member 15 (steps 45 and 46). That is, assume that the insufficient adjustment of the irradiation beam at the second predetermined magnification largely defocuses the beam on the multi-layer convex-concave structure part and therefore the diffraction grating pattern 10 of the silicon/molybdenum (Si/Mo) multi-layer convex-concave of the first area is too small to distinguish. Usually, it is not possible to resolve the high-definition pattern without beam adjustment. For this reason, according to the invention, in the next step, the magnification is increased to a third predetermined magnification (step 46), and a beam adjustment is performed in the silicon/molybdenum (Si/Mo) multi-layer convex-concave 11 of the second area (step 44).

For example, assume that in the silicon/molybdenum (Si/Mo) multi-layer convex-concave 11 of the second area, it is possible to distinguish, even in the state before the beam adjustment (at the second predetermined magnification), the groove width (40 nm) of a silicon layer not less than a pitch size (40 nm) greater than the diffraction grating pattern pitch size (20 nm) of the silicon/molybdenum (Si/Mo) multi-layer convex-concave of the first area. In the pattern of the groove width (40 nm) of the silicon layer, the lenses 18 and 19 of an electron optical column are controlled by a lens control system, thereby performing an electron beam axis adjustment including an adjustment of the astigmatism and focus of the beam. As a result, on this beam condition, again, beam scanning is performed on the silicon/molybdenum (Si/Mo) multi-layer convex-concave structure part of the standard member, and a secondary electron signal waveform obtained through the secondary electron signal processing unit is observed on the waveform display unit. It becomes possible to distinguish the same pitch size (20 nm) as the diffraction grating pattern of the silicon/molybdenum (Si/Mo) multi-layer convex-concave of the first area.

Further, when the silicon/molybdenum (Si/Mo) multi-layer convex-concave 11 is observed on this beam condition, assume that it is not possible to distinguish the groove width (4 nm) of a silicon layer 6 not more than a pitch size (10 nm) less than the diffraction grating pattern pitch size (20 nm) of the silicon/molybdenum (Si/Mo) multi-layer convex-concave of the first area. In this case, the magnification is further increased to 400000× (third predetermined magnification). In the pattern of the groove width (4 nm) of the silicon layer 6, the lenses 18 and 19 of the electron optical column are controlled by the lens control system, thereby performing an electron beam axis adjustment including an adjustment of the astigmatism and focus of the beam so as to be able to distinguish the groove width (4 nm) of the silicon layer 6 in the second area. As necessary, similarly at an nth predetermined magnification, an electron beam axis adjustment is performed to reduce aberration including the astigmatism and focus of the electron beam so as to be able to resolve as small a pattern in the second area as possible (steps 44 to 46).

Next, after the electron beam axis adjustment, the electron beam scanning is moved to the first pattern area by the deflection control unit, and the first pattern area is scanned at the same magnification as in the electron beam axis adjustment (steps 47 and 48). At this time, at the nth predetermined magnification, e.g., 400000× magnification (third predetermined magnification), the diffraction grating pattern 10 of the silicon/molybdenum (Si/Mo) multi-layer convex-concave of the first area cannot be viewed within the same visual field as the second pattern area. For this reason, on this beam condition, by beam deflection corresponding to a horizontal distance of 8 μm using the deflector 20 having a maximum deflection range of 10 μm, the beam scanning position is moved to the diffraction grating pattern 10 of the silicon/molybdenum (Si/Mo) multi-layer convex-concave of the first area, thereby to perform beam scanning.

By observing a secondary electron signal waveform on the waveform display unit obtained through the secondary electron signal processing unit, e.g. only by the beam adjustment of focus correction corresponding to a height of 0.5 μm, it is possible to obtain the secondary electron signal waveform of the convex-concave diffraction grating pattern of the silicon/molybdenum (Si/Mo) of the first area sharper than on the past beam condition.

On this beam condition, based on the secondary electron signal waveform on the waveform display unit obtained through the secondary electron signal processing unit obtained by scanning the electron beam on the convex-concave diffraction grating pattern of the silicon/molybdenum (Si/Mo) of the first area, a pitch size is obtained by the line width calculation unit (step 49). This measurement is repeated at different 20 points in the convex-concave diffraction grating pattern 10 of the silicon/molybdenum (Si/Mo) of the first area (steps 47 to 50).

Next, the average value of the 20 pitch sizes measured in step 49, e.g. 20.05 nm is obtained by calculation, and stored in the line width memory unit (step 51).

Next, the pitch size obtained by the line width calculation unit is compared, by the line width calibration calculation unit, with the pitch size (19.98 nm) obtained beforehand by the X-ray diffraction method and stored in the line width memory unit, thereby determining a calibration correction coefficient of the value measured by the beam (step 52). A correction is performed on the beam deflection control unit 252 so that the difference becomes zero, and the calibration correction coefficient is stored in the calibration parameter memory unit 263 (step 53).

On the other hand, the sample stage 21 is driven, and the length measurement of a pattern on the measurement wafer 22 is performed (step 54). The length measurement value is calibrated based on the calibration correction coefficient in the calibration parameter memory unit 263, and the calibrated value is displayed on the line width display unit 266 and the image display unit 267 and stored (step 55).

According to an experiment using the device of this embodiment, the surface of the holder 13 and the surface of the two silicon/molybdenum multi-layer cross sections 12 have a step of 1 μm or less and are in substantially the same plane; therefore, there was no disturbance in an surface electric field by a bias voltage of −1.5 kV applied to the stage, and no astigmatism modulation occurred on the beam condition on the surface of the two silicon/molybdenum multi-layer cross sections. As a result, a calibration precision of 0.25 nm or less was obtained.

Further, the surface of the silicon/molybdenum multi-layer cross sections 12 on the holder 13 has a height of 775 μm with respect to the surface of the stage 21 and the measurement silicon wafer 22 has a height of 775±5 μm, so that the height error is as small as 5 μm; accordingly, the accuracy of the actual length measurement of the pattern on the surface of the silicon wafer 22 after the calibration was not more than 0.1 nm.

On the other hand, according to the standard member of the conventional technique, since the convex-concave diffraction grating pattern of one cross-section substrate has the same pitch size or approximately the same pitch size as the convex-concave diffraction grating pattern of the other cross-section substrate, by light or X-ray diffraction the diffraction rays of the convex-concave diffraction grating patterns interfere with each other, so that the diffraction ray intensity enough for measurement was not obtained. For this reason, the pitch size was measured with a deposition thickness meter by the X-ray reflection method before the bonding of the two cross sections. However, in this method, film thickness information inside the substrate besides the cross-section surface is added, and due to measurement before etching and bonding, a change in size during production is unknown, which brings about uncertainty of the pitch size precision.

According to the standard member of the conventional technique, at the time of the adjustment of electron beam aberration such as focus and astigmatism, using the convex-concave diffraction grating pattern in the first pattern area, there is a problem that in the coarse adjustment, the convex-concave diffraction grating pattern is too small, which makes the adjustment difficult, or in the fine adjustment, the convex-concave diffraction grating pattern is too coarse relative to the beam diameter to perform a sufficient beam adjustment, so that the calibration precision is 0.5 nm or more.

According to the invention, it is possible to provide the scanning electron microscope including the standard member for calibration which calibrates the magnification with high precision.

Third Embodiment

Figure 6A:
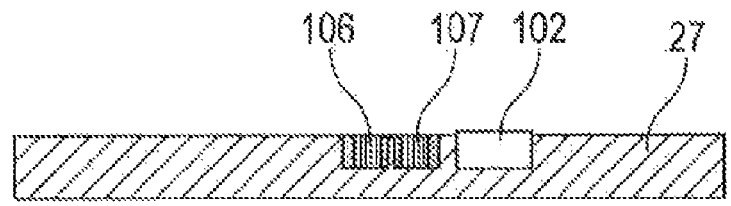
FIG. 6A is a longitudinal sectional view showing a standard member for calibration according to a second embodiment of the invention.
Figure 6B:
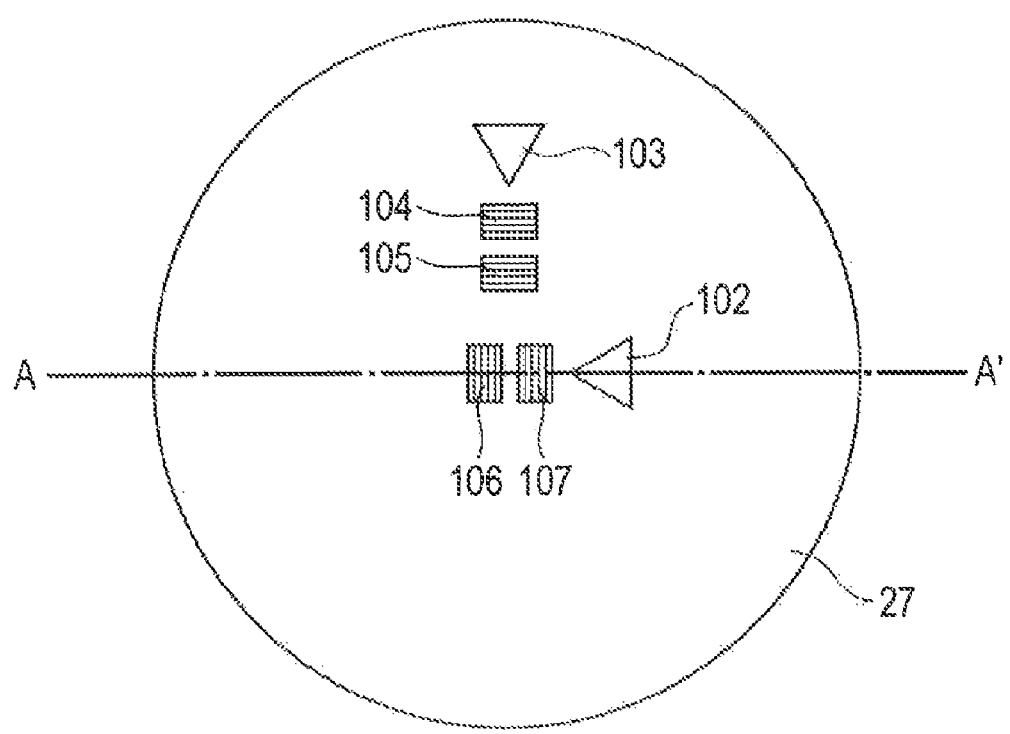
FIG. 6B is a top view of the standard member for calibration according to the second embodiment of the invention.
Figure 6C:
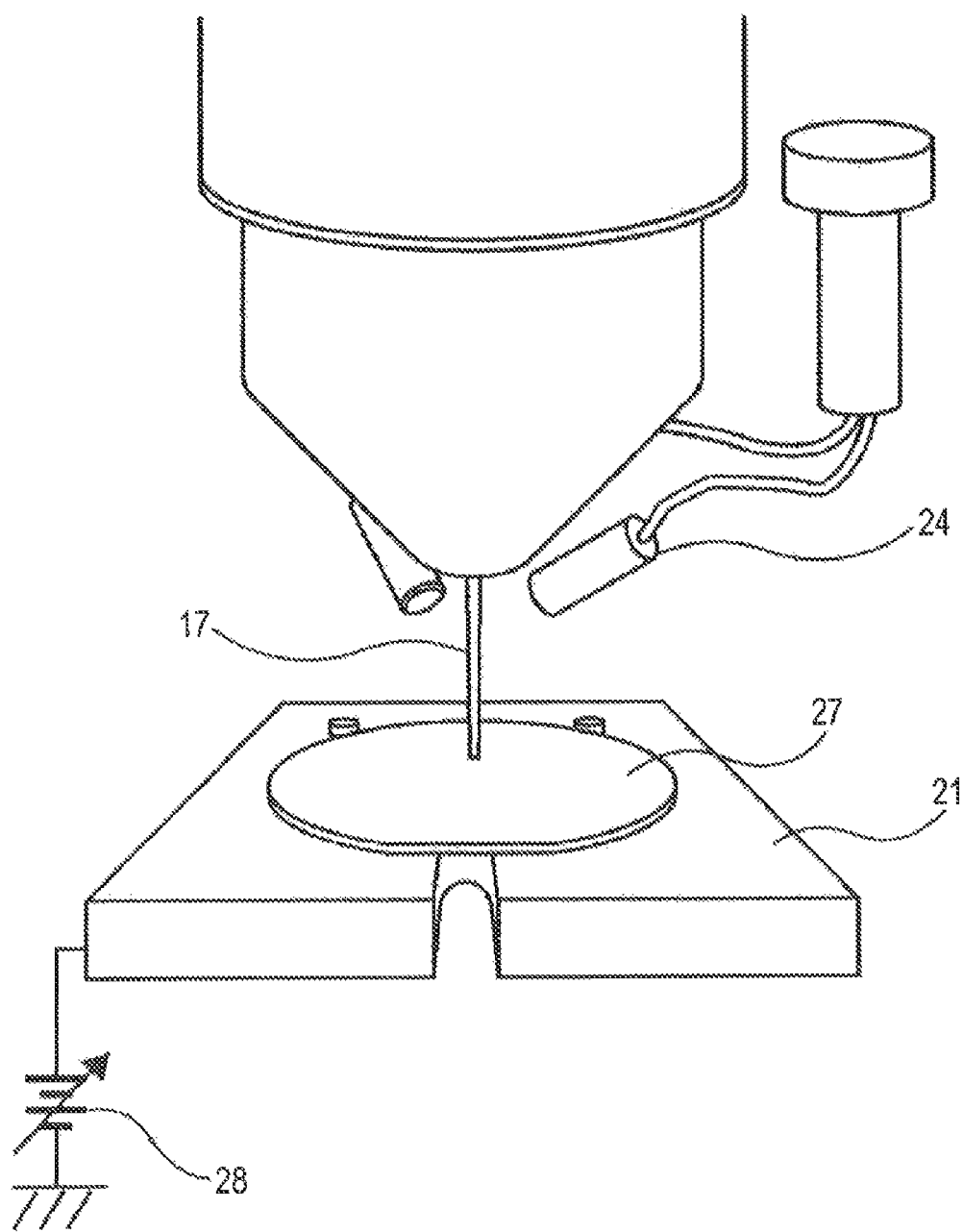
FIG. 6C is a view showing a usage state of the standard member for calibration according to the second embodiment.

The standard member according to the invention can also be applied in wafer form. Next, another example of the standard member for calibration will be described as the third embodiment of the invention, with reference to FIG. 6 (6A, 6B, 6C) and 7. FIG. 6B is a plan view of a standard member for calibration according to the third embodiment. FIG. 6A is a cross-sectional view taken along line A-A of FIG. 6B. FIG. 6C is an enlarged perspective view of the stage part of the scanning electron microscope, showing a usage state of the standard member for calibration.

In FIG. 6, reference numeral 27 denotes a wafer-type standard member; 102 and 103, pattern position identification marks; 104, a cross-section sample having the second pattern area; 105, a cross-section sample having the first pattern area; 106 and 107, silicon/molybdenum (Si/Mo) multi-layer convex-concave pattern (line/space pattern) areas; and 110, a concave area for multi-layer sample implantation. In this example, two pairs of patterns, with the pattern directions of the pairs forming an angle of 90 degrees, are formed in the same standard member 27. It is desirable that the size of the "pattern area for calibration" which is the horizontal distance from the outside end of the first pattern area of each pair to the outside end of the second pattern area be not greater than 10 μm as in the example of FIG. 1.

In this embodiment, as shown in FIG. 6C, first the standard member for calibration is placed on the stage, and the scanning electron microscope is calibrated. Then, the sample is measured on the stage.

FIG. 7 is a view showing the manufacturing method of the standard member for calibration. First, as shown in part (A) of FIG. 7, multi-layer cross-section samples are implanted in the wafer-type standard member 27. That is, the cross-section pieces 3 and 8 including the respective multi-layers of the first and second pattern areas are implanted, using the conductive adhesive 14, in a silicon substrate 26 where the concave area 110 is provided beforehand. At the time of producing the concave area 110 by etching, the pattern position identification mark 102 is produced as a concave area of the same depth by the same etching.

Next, as shown in part (B) of FIG. 7, the cross-section pieces 3 and 8 are grinded. That is, the silicon substrate 26 and the two cross-section samples 3 and 8 are prepared by grinding so as to have the same height.

Next, as shown in part (C) of FIG. 7, material selective etching is performed, thereby forming the wafer-type standard member 27 including the cross-section sample 10 having the first pattern area, the cross-section sample 11 having the second pattern area, and the pattern position identification mark 102.

With the wafer-type standard member 27, the same effect as in the first embodiment can be obtained.

Further, in the wafer-type standard member 27, with the same production method as for the cross-section sample (106) having the first pattern area, the cross-section sample 11 (107) having the second pattern area, and the pattern position identification mark 102; the cross-section sample 105 having the first pattern area, the cross-section sample 104 having the second pattern area, and the pattern position identification mark 103, whose pattern direction is rotated 90 degrees, can be formed in the same substrate.

According to this embodiment, it is possible to implement the electron beam aberration adjustment and magnification calibration of the scanning electron microscope with high precision. Further, it is possible to calibrate the scanning electron microscope by selecting either pair (106 and 107 or 105 and 104), from among the patterns for calibration, corresponding to the direction of a pattern of a semiconductor device or the like to be measured.

Fourth Embodiment

Figure 8A:
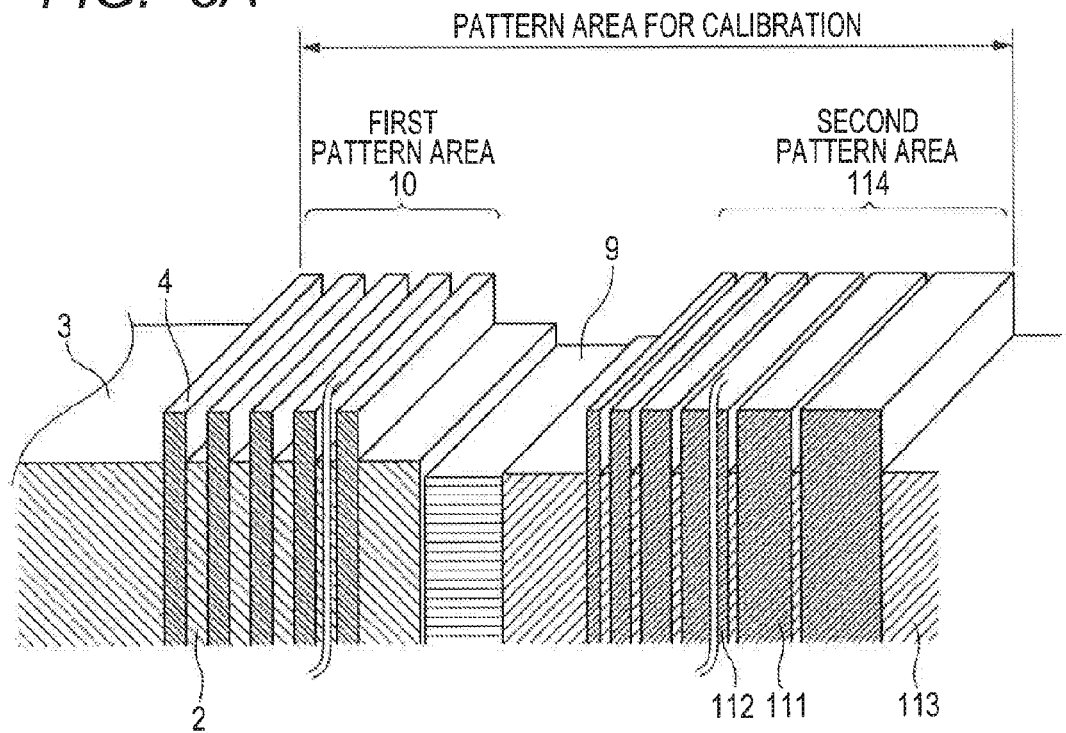
FIG. 8A is a schematic view showing a standard member for calibration according to a third embodiment of the invention and is an enlarged view showing a pattern area for calibration shown in FIG. 8B.
Figure 8B:
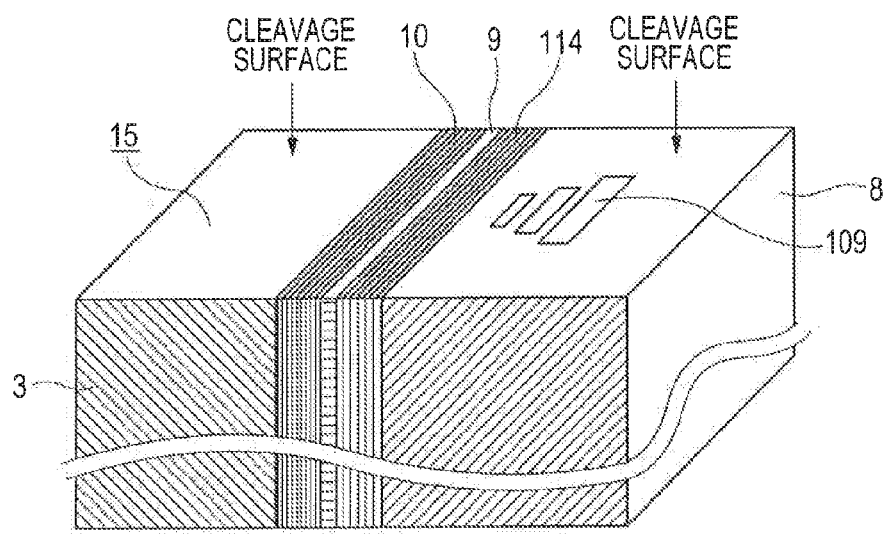
FIG. 8B is a schematic perspective view showing the standard member for calibration according to the third embodiment of the invention.

Next, another example of the standard member for calibration will be described as the fourth embodiment of the invention, with reference to FIG. 8 (FIGS. 8A and 8B). FIG. 8 is schematic views of a standard member for calibration according to this embodiment, in which FIG. 8B is a perspective view showing the entirety of a pattern for calibration, and FIG. 8A is an enlarged view showing a pattern area for calibration shown in FIG. 8B.

In the foregoing embodiments, the description has been made on the configuration of the pattern, for calibration, of the variable multi-layer pitch, in which the molybdenum layers 7 in the second pattern area 114 have the constant multi-layer thickness which leads to the constant line width of the convex pattern (a line pattern) and the silicon layers 6 have the varying thicknesses which lead to the varying space widths of the concave pattern (a space pattern). However, the same effect can be obtained with the configuration of the pattern, for calibration, of a variable multi-layer pitch, in which molybdenum layers 111 in the second pattern area 114 have varying multi-layer thicknesses which lead to varying line widths and silicon layers 112 have a constant thickness which leads to a constant space width as shown in FIG. 8, in place of the foregoing configuration.

The configuration and production method of the sample shown in FIG. 8 are as follows. In the silicon/molybdenum multi-layer 1 which is the magnification calibration part, the silicon layers 2 in 40 silicon layers and 40 molybdenum layers, each layer having a thickness of 10 nm, formed in the silicon substrate 3 by ion beam deposition undergo material selective etching by about 20 nm in depth, thereby forming the periodic convex pattern (the line pattern) of the molybdenum layers 4.

First, for the silicon/molybdenum multi-layer 1, the silicon substrate 3 of 500 μm thick obtained by alternately forming, by ion beam deposition, 40 silicon layers and 40 molybdenum layers, each layer having a thickness of 10 nm, is cut out by cleavage by 10 mm long and 3 mm wide, as shown in FIG. 2.

Next, similarly, for the silicon/molybdenum multi-layer, the silicon substrate 113 of 500 μm thick obtained by alternately forming, by ion beam deposition, 20 molybdenum layers 111 with thicknesses increasing from 2 nm to 40 nm by 2 nm and the silicon layers 112 having a constant width of 5 nm is cut out by cleavage by 10 mm long and 3 mm wide, as shown in FIG. 8.

The multi-layer surfaces of these two cross-section samples are bonded back to back with the conductive adhesive 9 such that the cleavage surfaces of the two samples are at the same height. Then, the bonded cross-section sample is soaked in a potassium hydroxide aqueous solution for etching. As a result, only the silicon substrates 3 and 113 and the silicon layers 2 and 112 on the cleavage surface are etched by about 20 nm in depth, the periodic convex pattern (the line pattern) 10 of the molybdenum layers 4 is formed as the first pattern area on the cross section of one substrate of the bonded sample, and the pattern 114 including the arrangement of the concave pattern (the space pattern) of the silicon layers having a width of 5 nm and having the period pitch that decreases at smaller distances from the deposition surface is formed as the second pattern area on the cross section of the other substrate.

In this embodiment, the silicon layers 112 in the second pattern area 114 have the same thickness as the silicon layers 2 in the first pattern area 10, and the molybdenum layers 111 have the varying thicknesses. The second pattern area 114 has a variable multi-layer pitch at which the period pitch of the molybdenum layers 111 increases continuously from the conductive adhesive 9 side toward the outside.

Next, in order to determine which of the left and right pattern areas of the bonded cross-section sample 12 corresponds to the first pattern area or the second pattern area, a pattern position identification mark 109 of the pattern of different-sized rectangles is etched on the silicon substrate 113 near the second pattern area by 1 μm in depth by ion beam etching so as to be able to locate the second pattern area.

The convex-concave patterns in the first and second pattern areas are not limited to the shapes shown in the embodiments as long as they have the function of diffraction grating. The same applies to the materials.

The invention can be applied to any other electron beam device as well as the scanning electron microscope for length measurement shown in FIGS. 3 and 4.

Further, the multi-layer structures according to the embodiments are all made of conductive materials, which enables stable calibration without a charging phenomenon in measurement with the scanning electron microscope.

EXPLANATION OF REFERENCE SIGNS 1, 5: Multi-layer structure part
2, 6, 112: Silicon layer
4, 7, 111: Molybdenum layer
3, 8, 26, 113: Silicon substrate
9, 14: Conductive adhesive
10, 11, 104, 105, 106, 107, 114: Silicon/molybdenum (Si/Mo) multi-layer convex-concave pattern (line/space pattern) area
12: Material-selective-etched cross-section sample
13: Holder
15: Standard member
16: Electron gun
17: Electron beam
18, 19: Lens
20: Deflector
21: Stage
22: Measurement wafer sample
23: Secondary electron or reflected electron
24: Detector
25: Control system 27: Wafer-type standard member
28: Bias supply
103, 102, 108, 109: Pattern position identification mark
110: Concave area for multi-layer sample implantation

The invention claimed is:

1. A standard member for calibrating a scanning electron microscope, wherein the scanning electron microscope measures a pattern within an observation area based on information about an intensity of a secondary electron or a reflected electron generated by scanning an incident electron ray on the observation area on a measurement sample, the standard member comprising:
a first pattern area having a convex-concave pattern of a multilayer film cross section formed by laminating different materials periodically at a constant and fixed multi-layer pitch; and
a second pattern area having a convex-concave pattern of a multilayer film cross section formed by laminating different materials at a variable multi-layer pitch which provides varying pitch sizes in one direction,
wherein the convex-concave patterns of the first pattern area and the second pattern area are arranged adjacently on one axis and at substantially a same height, and
wherein the variable multi-layer pitch in the second pattern area includes at least one pitch size for coarse adjustment larger than the fixed multi-layer pitch in the first pattern area and at least one pitch size for high-definition adjustment smaller than the fixed multi-layer pitch in the first pattern area.

2. The standard member for calibration according to claim 1,
wherein the convex-concave pattern in the first pattern area is formed by selectively etching one of the different materials, in the cross section of a multilayer film formed by laminating the different materials periodically at the constant and fixed multi-layer pitch, and
wherein the convex-concave pattern in the second pattern area is formed by selectively etching one of the different materials, in the cross section of a multilayer film formed by laminating the different materials at the variable multi-layer pitch which provides varying pitch sizes in one direction.

3. The standard member for calibration according to claim 1,
wherein at a first standard magnification of the scanning electron microscope, the first pattern area, the second pattern area, and a pattern position identification mark are within the same visual field with respect to an incident electron.

4. The standard member for calibration according to claim 3,
wherein a horizontal distance, with respect to the incident electron, of the first pattern area and the second pattern area is 10 μm or less.

5. The standard member for calibration according to claim 1,
wherein a height of a substrate surface of the second pattern area with respect to the incident electron is substantially the same as a height of a substrate surface of the first pattern area with respect to the incident electron.

6. The standard member for calibration according to claim 5,
wherein a difference between the height of the substrate surface of the second pattern area and the height of the substrate surface of the first pattern area is 1 μm or less.

7. The standard member for calibration according to claim 1,
wherein the fixed multi-layer pitch in the first pattern area ranges between 2 nm and 90 nm, and the variable multi-layer pitch in the second pattern area ranges between 1 nm and 100 nm.

8. The standard member for calibration according to claim 1,
wherein the first pattern area is formed by alternately laminating a plurality of silicon layers of a same thickness and a plurality of molybdenum layers of a same thickness, and is composed of a periodic convex-concave pattern produced by etching the silicon layers, and
wherein the second pattern area is formed by alternately laminating a plurality of silicon layers of different thicknesses and a plurality of molybdenum layers of a same thickness, and is composed of an inconstant-pitch convex-concave pattern produced by etching the silicon layers.

9. The standard member for calibration according to claim 1,
wherein the first pattern area is formed by alternately laminating a plurality of silicon layers of a same thickness and a plurality of molybdenum layers of a same thickness, and is composed of a periodic convex-concave pattern produced by etching the silicon layers, and
wherein the second pattern area is formed by alternately laminating a plurality of silicon layers of a same thickness and a plurality of molybdenum layers of different thicknesses, and is composed of a variable-pitch convex-concave pattern produced by etching the silicon layers.

10. The standard member for calibration according to claim 1,
wherein the second pattern area is formed on a second substrate different from a first substrate where the first pattern area is formed, and
wherein the standard member has a structure formed by bonding the first substrate and the second substrate.

11. The standard member for calibration according to claim 1,
wherein a periodic-pattern pitch size in the second pattern area includes a periodic pattern having a pitch size other than the fixed multi-layer pitch of the first pattern area and an integral multiple thereof.

12. The standard member for calibration according to claim 1,
wherein a pitch size of the convex-concave pattern in the first pattern area is obtained by light or X-ray diffraction.

13. The standard member for calibration according to claim 1,
wherein the standard member is a wafer-type standard member having the same size as the measurement sample, and
wherein two pairs of convex-concave patterns having the first pattern area and the second pattern area are formed, with pattern directions of the pairs forming an angle of 90 degrees.

14. A scanning electron microscope comprising:
a sample stage for holding a sample or a standard member for calibration;
an irradiation optical system for scanning an electron beam on the sample on the sample stage;
a detector for detecting a secondary electron or a reflected electron generated by electron beam scanning;
a signal processing unit for performing length measurement of the sample by processing an electronic signal obtained from the detector;
a display unit for displaying a result of length measurement;
a bias supply for applying voltage for controlling electron beam accelerating voltage to the sample stage; and a calibration unit for calibrating a magnification of the irradiation optical system based on information about an intensity of the secondary electron or the reflected electron for the standard member for calibration mounted on the sample stage, wherein the scanning electron microscope measures a pattern within an observation area based on information about an intensity of a secondary electron or a reflected electron generated by scanning an incident electron ray on the observation area on a measurement sample, wherein the standard member for calibration comprises:

a first pattern area having a convex-concave pattern of a multilayer film cross section formed by laminating different materials periodically at a constant and fixed multi-layer pitch; and a second pattern area having a convex-concave pattern of a multilayer film cross section formed by laminating different materials at a variable multi-layer pitch which provides varying pitch sizes in one direction, wherein the convex-concave patterns of the first pattern area and the second pattern area are arranged adjacently on one axis and at substantially a same height, and wherein the variable multi-layer pitch in the second pattern area includes at least one pitch size for coarse adjustment larger than the fixed multi-layer pitch in the first pattern area and at least one pitch size for high-definition adjustment smaller than the fixed multi-layer pitch in the first pattern area.

15. The scanning electron microscope according to claim 14, wherein a pitch size of the first pattern which is the convex-concave pattern is obtained beforehand by light or X-ray diffraction.

16. The scanning electron microscope according to claim 15, having a function of comparing a pitch size of either film obtained by the signal processing means with the pitch size obtained beforehand by light or X-ray diffraction and calibrating a magnification of the irradiation optical system so that the difference becomes approximately zero.

17. The scanning electron microscope according to claim 14, wherein the standard member for calibration is a wafer-type standard member having the same size as the measurement sample, and can be mounted on the sample stage.

18. A scanning electron microscope calibration method for calibrating a scanning electron microscope which measures a pattern within an observation area based on information about an intensity of a secondary electron or a reflected electron generated by scanning an incident electron ray on the observation area on a measurement sample, wherein the scanning electron microscope comprises a sample stage for holding a sample or a standard member for calibration, an irradiation optical system for scanning an electron beam on the sample on the sample stage, a detector for detecting a secondary electron or a reflected electron generated by electron beam scanning, a signal processing unit for performing length measurement of the sample by processing an electronic signal obtained from the detector, a display unit for displaying a result of length measurement, a bias supply for applying voltage for controlling electron beam accelerating voltage to the sample stage, and a calibration unit for calibrating a magnification of the irradiation optical system based on information about an intensity of the secondary electron or the reflected electron for the standard member for calibration mounted on the sample stage, wherein the standard member for calibration includes a first pattern area having a convex-concave pattern of a multilayer film cross section formed by laminating different materials periodically at a constant and fixed multi-layer pitch, and a second pattern area having a convex-concave pattern of a multilayer film cross section formed by laminating different materials at a variable multi-layer pitch which provides varying pitch sizes in one direction, wherein the convex-concave patterns in the first pattern area and the second pattern area are arranged adjacently on one axis and at substantially a same height, wherein the scanning electron microscope calibration method comprising steps of:

performing a coarse adjustment using a variable multi-layer pitch of a pitch size, in the convex-concave pattern in the second pattern area, larger than the fixed multi-layer pitch in the first pattern area;

performing a high-definition adjustment using a variable multi-layer pitch of a pitch size, in the convex-concave pattern in the second pattern area, smaller than the fixed multi-layer pitch in the first pattern area; and comparing the variable multi-layer pitch size and the fixed multi-layer pitch size of either film obtained by the signal processing means with a pitch size obtained beforehand by light or X-ray diffraction and calibrating a magnification of the irradiation optical system so that the difference becomes approximately zero.

19. The scanning electron microscope calibration method according to claim 18, wherein at a first standard magnification of the scanning electron microscope, the second pattern area, the first pattern area, and a pattern position identification mark in the standard member for calibration are within the same visual field with respect to an incident electron, and wherein the second pattern area is positioned directly under the electron beam, using the pattern position identification mark.

20. The scanning electron microscope calibration method according to claim 19, comprising steps of:

driving the stage, observing the standard member at the first standard magnification, and detecting the pattern position identification mark;

moving the second pattern area directly under the electron beam in accordance with a direction indicated by the pattern position identification mark, and scanning the electron beam on the standard member at a second standard magnification higher than the first standard magnification;

adjusting a lens control unit based on a secondary electron signal waveform in the second pattern area of the standard member, and thereby performing a coarse adjustment and a fine adjustment in an electron beam axis adjustment, using each pattern of the variable multi-layer pitch in the second pattern area;

moving, by the deflection control unit, electron beam scanning to the first pattern area, scanning the first pattern area at the same magnification as in the fine adjustment in the electron beam axis adjustment, and detecting a secondary electron signal;

measuring a pitch size of the convex-concave pattern of the fixed multi-layer pitch in the first pattern area based on the secondary electron signal waveform;

comparing the pitch size of the convex-concave pattern with a pitch size obtained by an X-ray diffraction method and determining a calibration correction coefficient of a value measured by the electron beam; and storing the calibration correction coefficient in a memory device.

* * * * *